(12) United States Patent
Thompson

(10) Patent No.: US 8,298,610 B2
(45) Date of Patent: Oct. 30, 2012

(54) PROCESS FOR INHIBITING OXIDE FORMATION ON COPPER SURFACES

(75) Inventor: Jeffery Scott Thompson, West Chester, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/414,818

(22) Filed: Mar. 8, 2012

(65) Prior Publication Data

US 2012/0160266 A1 Jun. 28, 2012

(51) Int. Cl.
*H01C 17/075* (2006.01)
*C08J 5/12* (2006.01)
*C04B 9/02* (2006.01)

(52) U.S. Cl. .................... 427/96.4; 106/287.3; 106/14.5

(58) Field of Classification Search .................. None
See application file for complete search history.

(56) References Cited

U.S. PATENT DOCUMENTS

| | | | |
|---|---|---|---|
| 4,492,494 A | * | 1/1985 | Szekely et al. ................ 405/264 |
| 6,723,691 B2 | | 4/2004 | Naghshinch et al. |
| 7,188,630 B2 | | 3/2007 | Flake et al. |

* cited by examiner

*Primary Examiner* — David J Blanchard
*Assistant Examiner* — Tigabu Kassa
(74) *Attorney, Agent, or Firm* — Kevin S. Dobson

(57) ABSTRACT

This invention provides processes for inhibiting the formation of copper oxides on substantially oxide-free copper surfaces by contacting a substantially oxide-free copper surface with a bifunctional ligand that contains both a metal-coordinating group and a tertiary amine group in an aqueous solution of pH about 2 to about 5.5. A thin layer of the bifunctional ligand formed by coordination of the dialkylaminoacetonitrile to the copper surface can be removed by heating under vacuum to regenerate a substantially oxide-free copper surface.

5 Claims, No Drawings

PROCESS FOR INHIBITING OXIDE FORMATION ON COPPER SURFACES

FIELD OF THE INVENTION

The present invention relates to processes for inhibiting oxide formation of copper surfaces exposed to air.

BACKGROUND

The manufacture of ultra-large scale integrated circuits typically involves a chemical-mechanical planarization (CMP) step in which a patterned copper surface is subjected to a polishing process using a combination of abrasives and chemical agents. This CMP step is typically followed by a post-CMP clean step (pCMP) to remove residues left by the CMP step from the semiconductor work-piece surface without significantly etching the metal, leaving deposits on the surface, or imparting significant organic carbonaceous contamination to the semiconductor work-piece. Ideally, the cleaned work-piece proceeds immediately after the pCMP process into a vacuum environment for the next step of the manufacturing process. Because of queue time-related delays between wet and dry tools, work-pieces coming out of pCMP clean do not always promptly enter a vacuum (air-free) environment for the next process step, and surface copper oxide formation occurs. This oxide compromises device performance and must be removed from the copper surface prior to the deposition of the next layer in the preparation of copper interconnects on semiconductor chips. In the dual damascene process, the next layer is typically a silicon nitride cap layer deposited by plasma enhanced physical vapor deposition (PECVD).

The copper oxide layer is currently removed from the copper surface following pCMP cleaning steps by a plasma clean process. Although this plasma clean is effective, the exposure of the dielectric material surrounding the copper lines to the plasma during the cleaning cycle damages the dielectric material. With the introduction of more fragile low k dielectric materials in current and future generations of chips, this damage could be significant and could change the dielectric properties of the material, leading to failures.

In another step in chip fabrication, the semiconductor wafer is etched to create a pattern of vias and interconnect lines, followed by cleaning with a post-etch residue (PER) remover to clean the wafer of any debris resulting from the etching step. Copper lines exposed during the etching step are susceptible to copper oxide formation on contact with the ambient atmosphere. As in the case of pCMP cleaning, any copper oxide formed must be removed prior to deposition of the next layer, typically a barrier layer followed by copper layers. Typically, the copper oxide layer is removed via a plasma clean step that can damage the dielectric layer.

Copper surfaces exposed following pCMP cleaning and post-etch PER removal are susceptible to oxidation owing to the exposure of the copper surface to the ambient atmosphere.

A process is needed to prevent the formation of copper oxide on semiconductor work-pieces that is compatible with chip manufacturing processes and that does not damage sensitive dielectric layers.

SUMMARY OF THE INVENTION

One embodiment is a process comprising contacting a substantially oxide-free copper surface with an aqueous solution comprising an acid and a bifunctional ligand for a sufficient period of time to form a copper surface coated with a layer of the bifunctional ligand, wherein the bifunctional ligand comprises a nitrile group and a tertiary amine group attached to a carbon atom adjacent to the nitrile group, and the pH of the solution is about 2 to about 5.5.

DETAILED DESCRIPTION

It has been discovered that contacting a substantially oxide-free copper surface with a bifunctional ligand that contains both a nitrile group, and a tertiary amine group attached to a carbon atom of the ligand adjacent to the nitrile group, in an aqueous solution of pH about 2 to about 5.5, creates a thin layer of the bifunctional ligand on the copper surface that inhibits the formation of copper oxides. The bifunctional ligand can be removed by heating under vacuum to regenerate a substantially oxide-free copper surface. Typically, the layer, referred to herein as a "thin layer", of bifunctional ligand is from one monolayer to several monolayers thick. Preferably, the layer of bifunctional ligand is from about 5 to about 50 Angstroms thick.

By "substantially oxide-free" is meant that less than 2 atom % of the copper surface atoms are coordinated to oxygen. At these levels, the oxygen atoms are below the X-ray photoelectron spectroscopy (XPS) detection limit. Substantially oxide-free copper surfaces can be obtained by processes known in the art such as treatment with acidic solution, plasma treatment, and electrochemical reduction.

In one embodiment, the aqueous solution contains one or more acids to achieve and maintain the pH between about 2 and about 5.5. Suitable acids include citric acid, formic acid, acetic acid, glycolic acid, methanesulfonic acid, oxalic acid, lactic acid, xylenesulfonic acid, toluenesulfonic acid, tartaric acid, propionic acid, benzoic acid, ascorbic acid, gluconic acid, malic acid, malonic acid, succinic acid, gallic acid, butyric acid, trifluoroacetic acid, glycolic acid, and mixtures thereof. In one embodiment, the acids are selected from citric acid and glycolic acid.

Suitable bifunctional ligands are dialkylaminonitriles that contain both a nitrile group and a tertiary amine group. Suitable bifunctional ligands include dimethylaminoacetonitrile and diethylaminoacetonitrile. These molecules are bifunctional with a nitrile group and a tertiary amine group attached to a carbon atom adjacent to the nitrile group. In one embodiment, the bifunctional ligand is present in an amount of 0.08 to 5 wt %, based on the total weight of the aqueous solution. In another embodiment, the bifunctional ligand is present in an amount of 0.1 to 2.5 wt %, preferably 0.2 to 1 wt %, based on the total weight of the aqueous solution.

In one embodiment, the bifunctional ligand comprises a moiety represented by

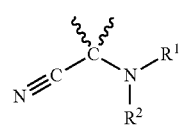

where $R^1$ and $R^2$ are independently selected from methyl and ethyl.

In one embodiment, the aqueous solution comprises (a) a bifunctional ligand comprising a moiety represented by

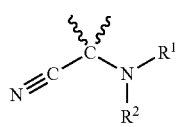

where $R^1$ and $R^2$ are independently selected from methyl and ethyl; and (b) sufficient acid so that the pH of the aqueous solution is between about 2 and about 5.5.

In one embodiment, the aqueous solution contains metal chelating agents and one or more additives selected from the group consisting of organic solvents, anticorrosive agents, and surfactants. Such aqueous solutions can be used as pCMP cleaning solutions.

Suitable metal chelating agents include, but are not limited to, (ethylenedinitrilo)tetraacetic acid (EDTA), terpyridine, citric acid, gluconic acid, gallic acid, pyrogallol, oximes such as salicylaldoxime, 8-hydroxyquinoline, polyalkylenepolyamines, crown ethers, oxalic acid, maleic acid, malonic acid, malic acid, tartaric acid, aspartic acid, benzoic acid, gluconic acid, glycolic acid, succinic acid, salts of the aforementioned acids or mixtures of the acids or their salts, acetylacetone, glycine, dithiocarbamates, amidoximes, catechol, and cysteine. The metal chelating agents are typically present in amounts of 500 ppm to 10 wt %, based on the total weight of the aqueous solution. In other embodiments, the metal chelating agents are present in amounts of 1 to 7.5 wt % or 1.5 to 5 wt %, based on the total weight of the aqueous solution.

Suitable organic solvents include alkyl alcohols such as ethanol and isopropanol. The organic solvents are present in amounts of 5 to 20 wt %, based on the total weight of the aqueous solution. In other embodiments, the organic solvents are 1.5 to 12 wt %, or 3 to 10 wt %, based on the total weight of the aqueous solution.

Suitable surfactants include cationic, anionic, amphoteric, and non-ionic surfactants including polyethylene glycols, polypropylene glycols, fluorosurfactants, polydimethysiloxane polymers and oligomers, polydimethylsiloxane ethylene oxide and propylene oxide block copolymers and oligomers, carboxylic acid salts, cellulosic surfactants such as hydroxypropylmethylcellulose and methylcellulose, polyalkylglycolethers, alkyl and aryl sulfonic acids, polyethyleneglycol alkyl ethers such as Brij® or Triton® surfactants (available from Sigma Aldrich, St. Louis, Mo.) and phosphate-based surfactants. In one embodiment, the surfactants are present in amounts of 0.5 to 5 wt %, based on the total weight of the aqueous solution. In other embodiments, the surfactants are present in amounts of 0.01 to 0.2 wt %, or 0.02 to 0.1 wt %, based on the total weight of the aqueous solution.

In another embodiment, the aqueous solution further comprises one or more additives selected from the group consisting of corrosion-inhibiting compounds and surface-active agents. Suitable corrosion-inhibiting compounds include: azoles such as benzotriazole, 1,2,4-triazole, and imidazole; thiols such as mercaptoethanol, mercaptopropionic acid, mercaptothiazoline, mercaptobenzothiazol, and thiolglycerol; and organic reducing agents such as ascorbic acid, hydroquinone, caffeic acid, glucose, tannic acid, methoxyphenol, and resorcinol. In one embodiment, the corrosion-inhibiting compounds are typically present in amounts of 0 ppm to 5 wt %, based on the total weight of the aqueous solution. In other embodiments, the corrosion-inhibiting compounds are present in amounts of 0 to 2.5 wt %, or 0 to 1 wt %.

Suitable bifunctional ligands include dimethylaminoacetonitrile and diethylaminoacetonitrile. In one embodiment, the bifunctional ligands are present in amounts of 0.1 to 5 wt %, based on the total weight of the aqueous solution. In other embodiments, the bifunctional ligands are present in amounts of 0.1 to 2.5 wt %, or 0.2 to 1 wt %, based on the total weight of the aqueous solution.

In another embodiment, the aqueous solution comprises a bifunctional ligand comprising a metal-coordinating nitrile group and a tertiary amine group, a fluoride or fluoride equivalent, a water miscible organic solvent, and an acid comprising one or more carboxylate moieties, wherein the pH of the solution is about 2 to about 5.5. Such an aqueous solution is useful as a PER cleaning solution and can further comprise corrosion-inhibiting agents and/or phosphonate-containing chelators. Suitable fluorides and fluoride equivalents include fluoride-containing acids and metal-free salts thereof. The term "metal-free salt of a fluoride-containing acid" as used herein means that the salt anion (or cation) does not contain a metal (e.g., sodium or potassium). Suitable salts include those formed by combining a fluoride-containing acid such as hydrogen fluoride, tetrafluoroboric acid, and/or trifluoroacetic acid, with any of: ammonium hydroxide; a C1-C4 alkyl quaternary ammonium ion, such as tetramethylammonium, tetraethylammonium or trimethyl(2-hydroxyethyl)ammonium; or a primary, secondary or tertiary amine, such as monoethanolamine, 2-(2-aminoethylamino)ethanol, diethanolamine, 2-ethylaminoethanol or dimethylaminoethanol. In one embodiment, the fluorides or fluoride equivalents are typically present in amounts of 0.005 to 0.6 wt %, based on the total weight of the aqueous solution. In other embodiments, the fluorides or fluoride equivalents are present in amounts of 0.0175 to 0.043 wt %, or 0.0175 to 0.038 wt %, based on the total weight of the aqueous solution.

In one embodiment, the aqueous solution contains one or more acids to achieve and maintain the pH between about 2 and about 5.5 Preferred organic acids are carboxylic acids, e.g., mono-, di- and/or tri-carboxylic acids optionally substituted in a beta position with an hydroxy, carbonyl or amino group. Organic acid species useful in the composition include but are not limited to formic acid, acetic acid, propanoic acid, butyric acid and the like; hydroxy substituted carboxylic acids including but not limited to glycolic acid, lactic acid, tartaric acid and the like; oxalic acid; carbonyl substituted carboxylic acids including but not limited to glyoxylic acid, and the like; amino substituted carboxylic acids including but not limited to glycine, hydroxyethylglycine, cysteine, alanine and the like; cyclic carboxylic acids including but not limited to ascorbic acid and the like; oxalic acid, nitrilotriacetic acid, citric acid, and mixtures thereof. Mono- and di-carboxylic acids having between 1 and 8 carbon atoms, preferably between 2 and 6 carbon atoms, and are substituted in an alpha, beta, or both positions with an hydroxy and/or carbonyl group, are preferred organic acids. More preferred are organic acids with a carbonyl group substituted on the carbon adjacent to the carboxyl group carbon. Exemplary preferred organic acids are oxalic acid, glyoxylic acid, citric acid, glycolic acid, or mixtures thereof. In selected embodiments, the organic acids are present in amounts of 2 to 10 wt %, or 2.7 to 10 wt %, or 2 to 4 wt %, based on the total weight of the aqueous solution.

Suitable water-miscible organic solvents include: dimethyl sulfoxide; ethylene glycol; organic acid alkyl (e.g., $C_1$-$C_6$) esters, such as ethyl lactate; ethers, such as ethylene glycol alkyl ether, diethylene glycol alkyl ether triethylene glycol alkyl ether, propyleneglycol, and propylene glycol alkyl ether; N-substituted pyrrolidones, such as N-methyl-2-pyrrolidone; sulfolanes; dimethylacetamide; and any combination thereof. In one embodiment where a polar organic solvent is present, the boiling point of the polar organic solvent is at least about 85° C., alternatively at least about 90° C., or at least about 95° C. In one embodiment, the water-miscible solvents are present in amounts of 1 wt % to less than 20 wt %, based on the total weight of the aqueous solution. In other embodiments, the water-miscible solvents are present in amounts of 1.5 to 12 wt %, or 3 to 10 wt %, based on the total weight of the aqueous solution.

Suitable phosphonate-containing chelators include amino trimethylphosphonic acid, hydroxyethylidene 1,1-diphosphonic acid, hexamethylene diamine tetra methylene phosphonic acid, diethylenetriamine pentamethylene phosphonic acid, bishexamethylen triamine penta methylene phosphonic acid, and hydroxyethylidene 1,1-diphosphonic acid (DQUEST™ 2010). In one embodiment, the chelating agent, if present, is present in amounts from about 0.01 to about 5 wt %, based on the total weight of the aqueous solution. In other embodiments, the chelating agent is present in amounts from about 0.01 to 0.2 wt %, or 0.02 to 0.1 wt %, based on the total weight of the aqueous solution.

Suitable bifunctional ligands include dimethylaminoacetonitrile and diethylaminoacetonitrile. In one embodiment, the bifunctional ligands are present in amounts of 0.1 to 5 wt %, based on the total weight of the aqueous solution. In other embodiments, the bifunctional ligands are present in amounts of 0.1 to 2.5 wt %, or 0.2 to 1 wt %, based on the total weight of the aqueous solution.

In one embodiment, a substantially oxide-free copper surface is contacted with an aqueous solution of pH about 2 to about 5.5 that comprises a bifunctional ligand containing both a nitrile group and a tertiary amine group for a sufficient period of time to form a copper surface coated with a thin layer of the bifunctional ligand.

In a further embodiment, the coated copper surface is rinsed to remove excess solution and optionally dried.

In a further embodiment, the coated copper surface is heated under vacuum at a temperature of 150-300° C. for 5-120 seconds to yield a substantially oxide-free surface with the copper in the metallic state. Although some surface oxidation (i.e., generation of Cu(I) and Cu(II) species) may occur at the copper surface on exposure to the ambient atmosphere following formation of the coating, heating the coated surface under vacuum as described removes the layer of the bifunctional ligand and generates a substantially oxide-free copper surface. Surface oxide (e.g., $Cu_2O$ and CuO) is not observed over exposure times up to 72 hours or longer on copper surfaces treated with the bifunctional ligands. The coating can also be removed with brief plasma cleaning. The process can prevent deep oxide formation on the copper surface, as shown by XPS analysis of surfaces.

Because the thin layer of the bifunctional ligand can be removed by heating under vacuum or in a reducing (e.g., $N_2/H_2$) plasma, the surface protection and coating removal steps can be integrated into the PECVD nitride cap step.

In one embodiment, a dialkylaminonitrile is used to create a thin layer of the bifunctional ligand on the copper surface during the pCMP cleaning process. The ligand can be added to the aqueous pCMP cleaning solution at the start of the cleaning cycle, during the cleaning cycle, or after the cleaning step. If it is added after the cleaning step, an aqueous solution with pH between about 2 and about 5.5 that contains the ligand is added to cleaning solution. Acid is added as needed to adjust and maintain the solution pH between about 2 and about 5.5. Excess aqueous solution is removed from the subsequent rinse step.

In another embodiment, the dialkylaminonitrile is used to create a thin layer of the bifunctional ligand on the copper surface during the PER cleaning process. The ligand can be added to the aqueous PER cleaning solution at the start of the cleaning cycle, during the cleaning cycle, or after the cleaning step. If it is added after the cleaning step, an aqueous solution with pH between about 2 and about 5.5 that contains the ligand is added to cleaning solution. Acid is added as needed to adjust and maintain the solution pH between 2 and 5.5. Excess aqueous solution is removed from the subsequent rinse step.

EXAMPLES

General: Physical vapor deposited copper on-silicon wafers were obtained from Sematech. Ion-chromatography grade water from a Satorius Arium 611 DI unit (Sartorius North America Inc., Edgewood, N.Y.) was used to prepare solutions and rinse glassware prior to use. Linear sweep voltammetry studies were performed with a Bioanalytical Systems CV-50W (West Lafayette, Ind.) in 0.1 M sodium perchlorate solution (Fischer, analytical grade). This reagent was used as received.

Citranox from Alconox is a liquid cleaner used to remove oxide and other contaminants from metal surfaces; it is supplied in a concentrated form and diluted prior to use.

X-ray photoelectron spectroscopy (XPS) studies of chemisorbed precursor were performed using a Physical Electronics PHI 5800ci spectrometer. The XPS system was under ultra-high vacuum with base pressure less than ~$5 \times 10^{-10}$ torr. The instrument was operated with an Al monochromatic X-ray source. A hemi-spherical analyzer was used to collect photoelectrons. A PHI Model 06-350 ion gun and a Model NU-04 neutralizer were used to compensate for charging effects. The analytical area was at 0.8-mm diameter. The escape depth of carbon was ~65 Å at 45° exit angle. PHI MultiPak@software version 6.0A was used for data analysis.

Example 1

A copper-on-silicon wafer was cleaned of carbonaceous materials by washing in carbon tetrachloride with sonication, followed by 2-propanol with sonication. The wafer was rinsed with ion-chromatography grade water and then cleaned in a 2% Citranox solution at pH 3 with sonication for 10 minutes at 50° C. The sample was then thoroughly rinsed with ion-chromatography grade water saturated with argon. The wafer was then transferred to an argon-filled glove bag, rinsed with deaerated ion-chromatograph grade water, allowed to dry under argon flow, and loaded into a transfer vessel for transport to the X-ray photoelectron spectrophotometer without exposure to the ambient atmosphere. The copper surface was analyzed by XPS and shown to be oxide free.

The above procedure was repeated. After the 10 minutes at 50° C. sonication in a 2% Citranox solution, dimethylaminoacetonitrile was added to the 2% Citranox solution to generate a final concentration of 50 mM. The wafer was soaked in this solution for two minutes at 50° C. The wafer was then rinsed with ion-chromatography grade water and exposed to the ambient atmosphere. XPS analysis of the surface after one hour exposure to the ambient atmosphere showed that the surface copper atoms are coordinated to nitrogen and that the surface contains carbonaceous material with oxygen and nitrogen. Surface infrared red analysis showed a strong nitrile stretch, confirming the presence of the nitrile on the copper surface. Time-of-flight secondary ion mass spectrometric data also support the presence of the thin organic layer. Similar results were obtained at longer exposures, up to 68 hours.

Heating the wafer to 200° C. for 1 minute under vacuum yielded an oxide free copper surface. XPS analysis of this surface confirms the presence of an oxide-free copper surface.

Example 2

A copper-on-silicon wafer was cleaned of carbonaceous materials by washing in carbon tetrachloride with sonication, followed by 2-propanol with sonication. The wafer was rinsed with ion-chromatography grade water and then cleaned in a 2% solution of DuPont EKC 5510; the pH of the solution was adjusted to 3.5 by the addition of citric acid prior to contact with the wafer. Cleaning of the copper wafer with this solution was performed by contacting the wafer with the solution at 50° C. for 8 minutes with ultrasonic cleaning. Sonication was then discontinued. Dimethylaminoacetonitrile was then added to bring the solution concentration to 50 mM, and the wafer was allowed to stand in the mixture for 2 minutes without ultrasonic agitation at 50° C. The sample was then rinsed with ion chromatography grade water and air dried. The sample was exposed to the ambient atmosphere for 68 hours. XPS and linear sweep voltammetric data show the presence of a Cu-dimethylaminoacetonitrile complex, but no copper oxides. Heating of the wafer to 200° C. for 5 minutes yielded a copper surface that was free of oxide contamination as shown by XPS data.

Example 3

A copper-on-silicon wafer was cleaned of carbonaceous materials by washing in carbon tetrachloride with sonication, followed by 2-propanol with sonication. The wafer was rinsed with ion-chromatography grade water, and then cleaned in a 2% solution of DuPont EKC 520 PER cleaner in the following manner. The wafer was contacted with this solution at 50° C. for 8 minutes with ultrasonic cleaning. Sonication was then discontinued. Dimethylaminoacetonitrile was then added to bring the solution concentration to 50 mM, and the wafer was allowed to stand in the mixture for 2 minutes without ultrasonic agitation. The sample was then rinsed with ion chromatography grade water and air dried. The sample was exposed to the ambient atmosphere for up to 48 hours. Linear sweep voltammetry showed the presence of a Cu-dimethylaminoacetonitrile complex, but no reduction waves associated with Cu(I) and Cu(II) oxides were observed.

Comparative Example A

A copper foil was cleaned of carbonaceous materials by washing in carbon tetrachloride with sonication, followed by 2-propanol with sonication. The wafer was rinsed with ion-chromatography grade water and then cleaned in a 4% solution of Citranox at pH 3. Cleaning of the copper wafer with this solution was performed by contacting the wafer with the solution at 50° C. for 8 minutes with ultrasonic cleaning. Sonication was then discontinued. methylaminoacetonitrile was then added to bring the solution concentration to 50 mM, and the wafer was allowed to stand in the mixture for 2 minutes without ultrasonic agitation at 50° C. The sample was then removed from the solution, rinsed with ion-chromatography grade water, and exposed to the ambient atmosphere for one hour. Analysis by linear sweep voltammetry from −140 mV to −1100 mV (versus Ag/AgCl reference electrode) showed the presence of copper oxide on the surface.

What is claimed is:

1. A process comprising contacting a substantially oxide-free copper surface with an aqueous solution comprising a bifunctional ligand for a sufficient period of time to form a copper surface coated with a layer of the bifunctional ligand, wherein the bifunctional ligand comprises a nitrile group and a tertiary amine group attached to a carbon atom adjacent to the nitrile group, and the pH of the solution is about 2 to about 5.5, and wherein the bifunctional ligand is dimethylaminoacetonitrile or diethylaminoacetonitrile.

2. The process of claim 1 wherein the layer of bifunctional ligand is from about 5 to about 50 Angstroms thick.

3. The process of claim 1, wherein the aqueous solution further comprises one or more additives selected from the group consisting of chelating agents, corrosion-inhibiting compounds, surface-active agents, organic solvents, fluorides, fluoride equivalents, anti-corrosive agents, and surfactants.

4. The process of claim 1, further comprising rinsing and/or drying the coated copper surface.

5. The process of claim 4, further comprising heating the coated copper surface at 100-300° C. for 5-120 seconds to remove the organic film and to yield an oxide-free copper surface.

* * * * *